United States Patent [19]

Ryu

[11] Patent Number: 4,835,614
[45] Date of Patent: May 30, 1989

[54] CONTROL METHOD FOR LIMITING WATCHING DISTANCE IN TELEVISION

[75] Inventor: Sang W. Ryu, Kyungsangbook, Rep. of Korea

[73] Assignee: Goldstar Co., Ltd., Seoul, Rep. of Korea

[21] Appl. No.: 114,743

[22] Filed: Oct. 30, 1987

[30] Foreign Application Priority Data

Oct. 31, 1986 [KR] Rep. of Korea ............... 16909[U]

[51] Int. Cl.[4] .................... H04N 5/65; H04B 9/00
[52] U.S. Cl. ................... 358/194.1; 358/108; 358/113; 358/188; 358/245; 340/555; 367/93; 367/95; 455/603; 455/604

[58] Field of Search ............ 358/245, 194.1, 188, 358/93, 107, 113; 455/603, 604, 352; 340/555; 367/93, 95

[56] References Cited

U.S. PATENT DOCUMENTS 4,417,278 11/1983 Hensleigh ............... 358/188
4,716,469 12/1987 Kim ........................ 358/245

Primary Examiner—Tommy P. Chin
Attorney, Agent, or Firm—Birch, Stewart, Kolasch & Birch

[57] ABSTRACT

A control method wherein a TV receiver, under the programmed control of a microcomputer, prevents infrared signals from a remote control transmitter and a watch-distance-limit-device transmitter from interfering with each other while using only one time-shared receiver for both functions.

1 Claim, 4 Drawing Sheets

CONTROL METHOD FOR LIMITING WATCHING DISTANCE IN TELEVISION

BACKGROUND AND SUMMARY OF THE INVENTION

This invention relates to a control method for limiting the watching distance of television and especially to provide a control method for preventing the mutual interference of infrared signals, in a transmission media between a remote controller and a and watching distance limit device.

Recently, watching television as too close a distance damages the viewer's eyesight. Some children sit nearer to watch the television set unintentionally, so their eyesight become worsened. There have been many attempts to keep viewers within a limited watching distance from the television set for protecting their eyesight. One of them is to automatically turn off the television set when viewers come close. But many problems have occurred when, for example, the interference occurs as a result of reflected infrared signals from a remote controller and a watching distance limit device. Furthermore, it unnecessarily causes a malfunction the remote controller or the watching distance limit device.

This invention has as its object to provide a method for controlling a microcomputer to prevent infrared signals as the transmission media of a remote controller and a watching distance limit device from providing mutual interference.

BRIEF DESCRIPTION OF THE DRAWINGS

This invention will be better understood from the detailed description given herein below and the accompanying drawings which are given by way of illustration only, and thus are not limitative of the present invention and wherein.

DETAILED DESCRIPTION OF THE INVENTION

Figure 1:
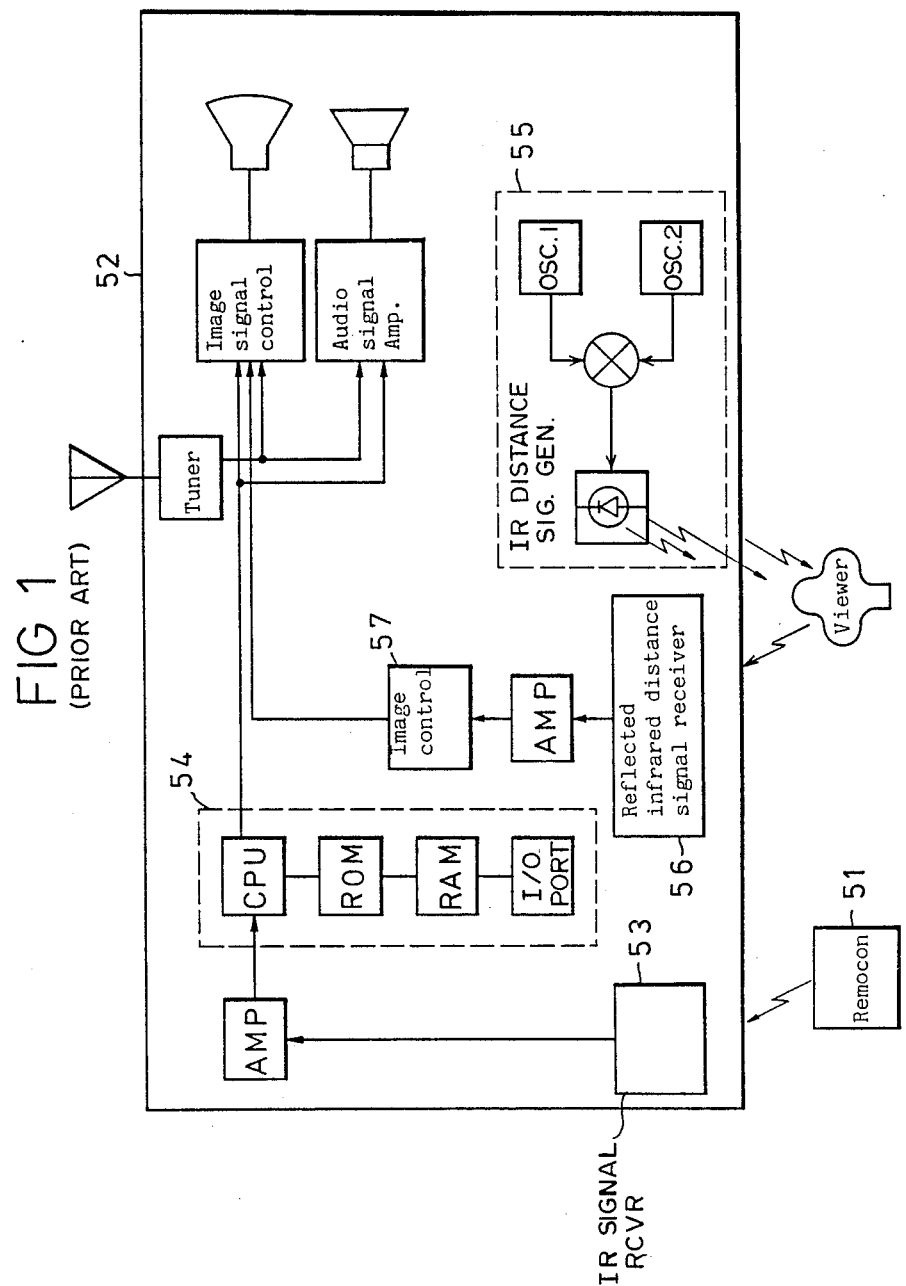
FIG. 1 is a conventional state of the art circuit for limiting the watching distance in a television set.

As seen in FIG. 1 there is illustrated the block diagram of the prior art to which the invention is directed. An infrared signal receiver 53 is installed to receive infrared control signals from a remote controller 51, hereinafter referred to as a "remocon". A micromputer 54 is installed to control the television receiver in response to the infrared control signal of the remocon 51, and an infrared distance signal generator 55 to limit the watching distance a, reflected distance infrared signal receiver 56 and a image control part 57 of television set are also shown.

A certain pulse code is transformed into an infrared signal and transmitted to the television set 52 according to the control keys of the remocon 51 when the viewer presses them, and the remocon infrared signals are received at the infrared signal receiver 53 of television set 52 and transformed into pulse code and decoded by the microcomputer 54 and all functions (channel change, volume control, power on/off, and etc.) of television are controlled.

At the infrared distance signal generator 55 the infrared signal is modulated into a certain frequency and emitted from the transmitter in front of the television set and the reflected distance signal is received at the infrared signal receiver 56 and then the distance between television set and viewer is calculated therein. When the reflected distance is closer than a predetermined registered standard distance, the picture of television is blanked out.

However in the prior art, the television set 52 always transmits the infrared distance signals, and when the viewer initiates infrared signals by the remocon 51, the infrared signal receiver 53 simultaneously receives remocon infrared signals and reflected distance infrared signals and thereby causes malfunction of microcomputer 54 at certain times. Also infrared signals the remocon 51 are often received at the reflected distance infrared signals receiver 56 so the controller 57 also sometimes malfunctions.

Furthermore in a television set where an infrared signal receiver 53 for infrared remocon signals and an infrared receiver 56 for distance infrared signals are required, two separate circuits must be installed for amplifying and detecting each of the received infrared signals, therefore, the numbers of components and production price are increased and the fabrication procedure becomes more complicated.

To remove such a limitation in the prior art, the microcomputer in the television divides the infrared signal receipt time interval into a separate time interval in accordance with the transmission time interval of watching-distance-limit infrared signals and remocon infrared signals receipt time interval, so as to prevent interference of watching distance limit infrared signals and remocon infrared signals and to prevent the malfunction of microcomputer in television and by using only one infrared signal receiver. Therefore the unnecessary overlapped circuit elements are reduced and the fabrication procedure is simplified and the production cost is cut down. The detailed description of this invention will be followed with figures.

Figure 2:
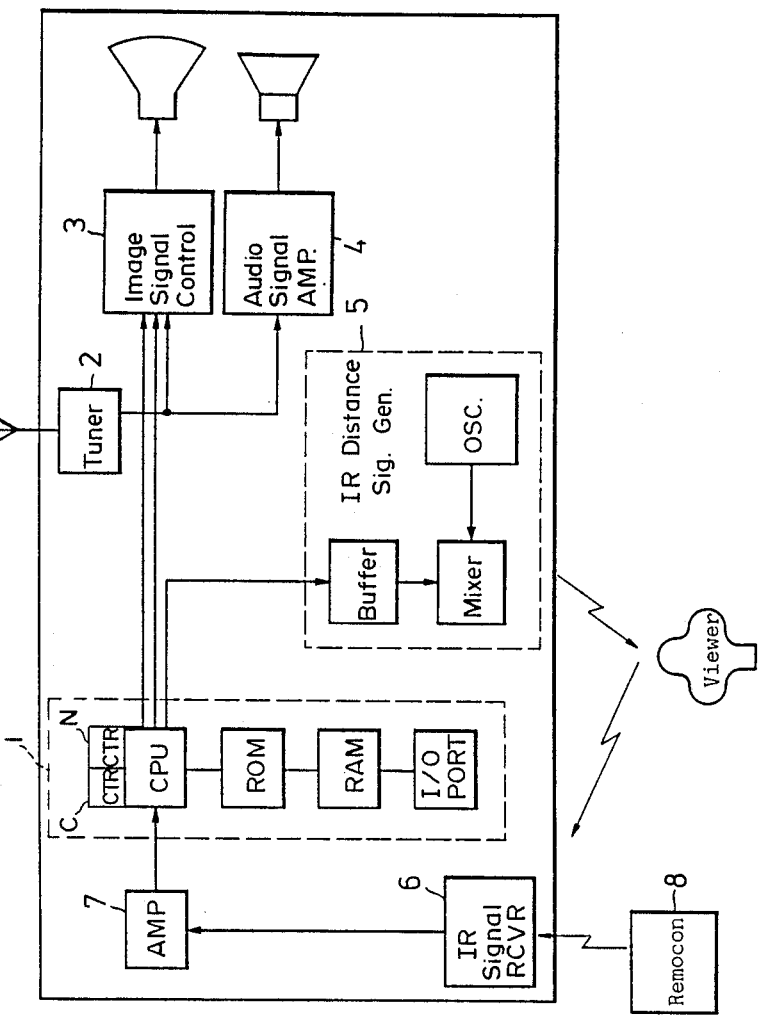
FIG. 2 is a circuit diagram according to the preferred embodiment of this invention.
Figure 3:
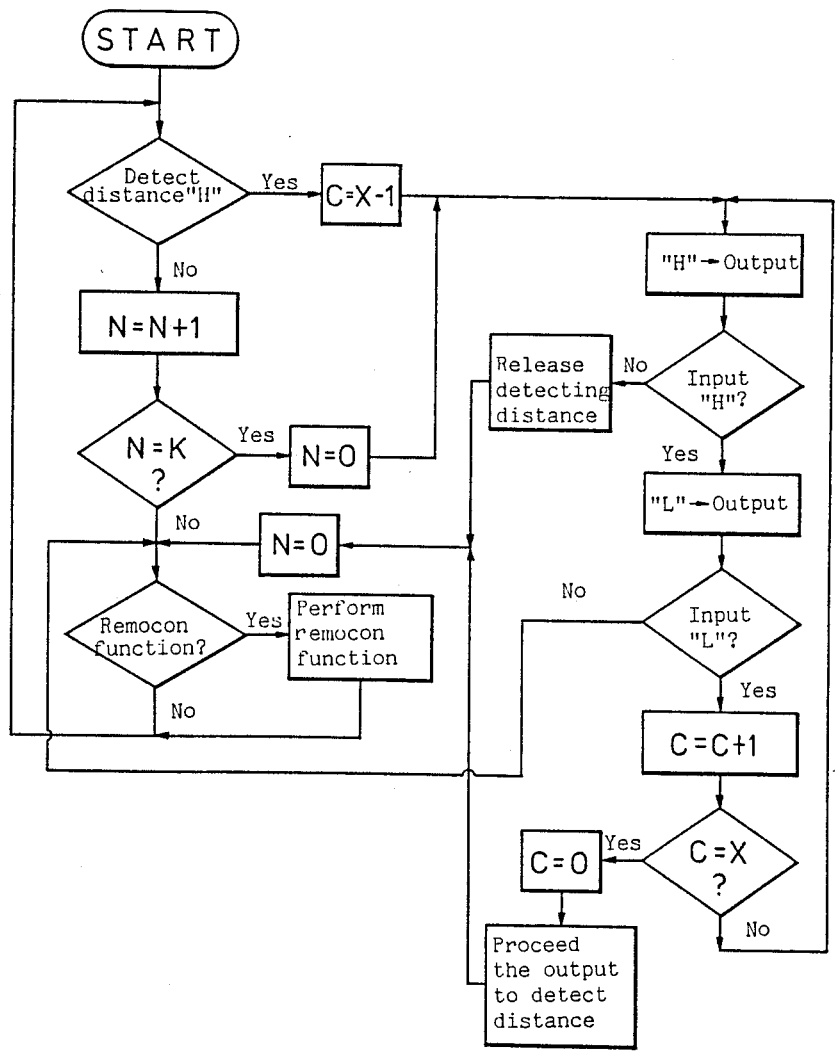
FIG. 3 is a flow chart of the computer program according to this invention.

As seen in FIG. 2, an embodiment of this invention to limit watching distance in the television includes a tuner 2, an image signal circuit 3, an audio signal circuit 4, a watching-distance-limit infrared signal generator 5, an infrared signal receiver 6 of which the output is connected to a microcomputer through the amplifier 7, a microcomputer 1 which controls the output time of watching-distance-limit infrared signal generator 5 in response to the infrared signal received by the receiver 6. The control method for limiting watching distance in television in this invention comprises the following steps included in a programmed memory (ROM) of the microcomputer 1 according to the flow chart as shown in FIG. 3.

The first step is to determine whether the distance detecting function is in operation or not;

The second step is to decrease by "1" the count value of a counter C in the watching distance detector implemented by the CPU when the distance detecting function is on, and to increase by "1" the count value of a time counter N when the distance detecting function is off;

The third step is to discriminate whether the count value of time counter N is a certain value (K) or not;

The fourth step is to reset the count value of time counter N to "Zero" and to transmit a pulse wave from infrared signal generator 5 when the count value is a certain value (K), and when counter value is not a certain value (K) to check whether or not a remocon function is required;

The fifth step is to return to the first step when a remocon function is not necessary, and to return to the first step after completing a remocon function when it is necessary;

The sixth step is to detect whether or not there is a reflected input above a certain level reflected from the output of infrared signals generator 5;

The seventh step is to return to the fourth step after releasing the distance detecting function and resetting the count value of time counter N to "Zero" when there is no reflected signal, and to generate a "Low" output when there is reflected signal and to detect again whether or not there is a reflected input signal above a certain level reflected from the output of infrared signal generator 5;

The eighth step is to return to the 4th step when there is no reflected input, and to detect whether or not the counter value of counter C is a certain value (X) after increasing it by "1" when there is a reflected input;

The ninth step is to return to the 4th step after resetting count value of counter N to "Zero" with watching distance limit procedure after setting the counter value to "Zero" when the counter value is a certain value (X), and to return to the 6th step when the counter value is not a certain value (X).

Figure 4:
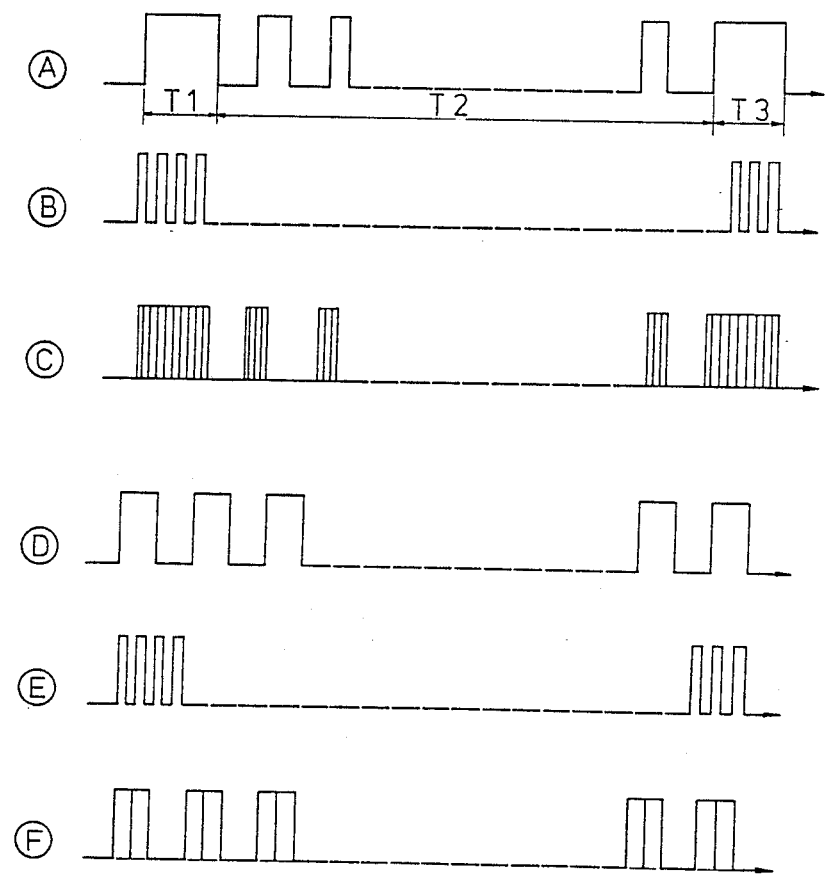
FIGS. 4 (A)-(F) are waveform diagrams helpful in explaining this invention.

The action and effectiveness of this invention is explained as follows with respect to FIG. 3 and FIGS. 4 (A)–(F). The viewer generates code signals as in (A) of FIG. 4 and consisting of a beginning pulse $T_1$, a password pulse $T_2$ and an end pulse $T_3$ in response to the each key of the remocon. The signals are modulated into high frequency signals like (B) of FIG. 4 which then become the signals as in (C) of FIG. 4. Signals (C) of FIG. 4 are transmitted as a remocon infrared signals through an infrared emitting diode installed in remocon device 8. The signals in FIG. 2 are received at receiver 6 of television and amplified and sent to the microcomputer 1. At microcomputer 1 these input signals are processed conventionally and permit the television perform its general function.

At the watching distance limit signal generator 5 pulses (D) of FIG. 4 are modulated into the high frequency signals (E) of FIG. 4 and pulses like (F) of FIG. 4 are generated and transmitted as infrared signals through an infrared emitting diode installed in the television. The infrared signals are received at the infrared signal receiver 6 when viewer is in front of the television sets, amplified at amplifier 7 and applied to microcomputer 1. In microcomputer 1, the applied input signal is treated according to the programming as described in flow chart of FIG. 3 and the control signals are applied to the image signal control section 3. When there is a viewer within a certain watching distance from the television, a positive pulse signal is generated at microcomputer 1 which cuts off a switch, not shown, in image signal control part 3 and the picture is blanked out.

Ordinarily, infrared signals for the remocon comprise of low frequency signals of several 100 [Hz]. In microcomputer 1, the output signal of the watching distance limit infrared signal generator 5 occurs during the absence of the remocon signal once in every second, and the reflected signals are received through infrared signal receiver 6. Then it is determined whether there is a viewer within a certain distance from the television set and to turn off the switch the image signal control section 3. The distance detection and its confirming procedure are completed within a time shorter than the least low time of the remocon signal (the duration between code pulse $T_2$ at (A) of FIG. 4).

The programming of microcomputer 1 according to this invention is started as shown in FIG. 3. When the distance H detecting function is in operation, then there is a confirmation of whether there is a viewer in front of television. When the distance detecting function is not in operation, the count value of counter N is increased by "1". When the count value of counter N is the same as a certain value (K), the counter value of counter N is reset with "Zero" and confirms whether or not there is a viewer in front of television and when the count value of counter N is different from a certain value (K) it is returned to the original status and the program is repeated. At this time in any situation when the remocon infrared signal is received at remocon device, the whole program is stopped and the remocon function is again performed.

Therefore as described above the, watching distance limit device is controlled by a microcomputer and the remocon signal and watching distance limit signal are seperated with time to prevent mutual interference of each of the signals. The number of components are thus reduced which operates; to lower the production cost and to reduce the fabrication procedure of manufacturing the television set.

What is claimed is:

1. A method of controlling a microcomputer to limit the watching distance and respond to a remote controller in a television including a tuner, an image signal circuit, an audio signal circuit, a watching distance limit infrared signal generator, and an infrared signal receiver from which an output is connected to the microcomputer through an amplifier, comprising the steps of:
    (a) determining whether or not a distance detecting function is in operation;
    (b) decreasing by "1" the count value of a first counter (C) in a watching distance detector portion of said microcomputer when said distance detecting function is in operation, and increasing by "1" the count value of a second counter (N) when the distance detecting function is not in operation;
    (c) determining whether or not the count value of said second counter (N) has a predetermined value (K);
    (d) resetting the count value of said second counter (N) to "zero" and transmitting a pulse wave from said distance limit infrared signal generator when the count value of said second counter (N) has said predetermined value (K) prior to said resetting and determining whether or not a remote control function is required when said count value is not of said predetermined value (K);
    (e) returning to said step (a) when said remote control function is not necessary and returning to said step (a) after completing said remote control function when it is necessary;
    (f) detecting whether or not there is a reflected input above a predetermined level received by said infrared signal receiver following transmission from said infrared signal generator;

(g) returning to step (d) after releasing said distance detecting function and resetting the count value of said second counter (N) to "zero" when there is no reflected signal received, then again determining whether or not there is a reflected input to said infrared receiver above a predetermined level which is transmitted from said infrared signal generator when a reflected signal is received;

(h) returning to step (d) in the event there is no reflected input to said infrared receiver, and determining whether or not the counter value of said first counter (C) has a predetermined value (X) after increasing the count thereof by "1" in the event there is a reflected input to the infrared signal receiver; and (i) returning to step (d) after resetting the counter value of said second counter (N) to "zero" and performing said distance detecting function after setting the counter value of said first counter (C) to "zero" when the counter value of said first counter (C) has said predetermined value (X) and returning to step (f) when the counter value of said first counter (C) is not of said predetermined value (X).

* * * * *